United States Patent
Wang

(10) Patent No.: US 12,262,474 B2
(45) Date of Patent: Mar. 25, 2025

(54) DISPLAY PANEL AND METHOD FOR ASSEMBLING SAME AND SPLICED DISPLAY DEVICE

(71) Applicant: Shenzhen China Star Optoelectronics Semiconductor Display Technology Co., Ltd., Guangdong (CN)

(72) Inventor: Kanmeng Wang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/600,310

(22) PCT Filed: Jul. 29, 2021

(86) PCT No.: PCT/CN2021/109157
§ 371 (c)(1),
(2) Date: Dec. 8, 2022

(87) PCT Pub. No.: WO2022/252375
PCT Pub. Date: Dec. 8, 2022

(65) Prior Publication Data
US 2024/0023247 A1    Jan. 18, 2024

(30) Foreign Application Priority Data
May 31, 2021    (CN) .......................... 202110598191.6

(51) Int. Cl.
H05K 1/18      (2006.01)
H01L 23/13     (2006.01)
(Continued)

(52) U.S. Cl.
CPC ............. *H05K 1/189* (2013.01); *H01L 23/13* (2013.01); *H01L 23/4985* (2013.01);
(Continued)

(58) Field of Classification Search
None
See application file for complete search history.

(56) References Cited

U.S. PATENT DOCUMENTS 5,959,709 A * 9/1999 Asada .................... H05K 1/147
                                                   349/150
6,407,508 B1 * 6/2002 Kawada ............. G02F 1/13452
                                                   257/668
(Continued)

FOREIGN PATENT DOCUMENTS

CN      104851892      8/2015
CN      104952373      9/2015
(Continued)

*Primary Examiner* — Krystal Robinson

(57) ABSTRACT

Embodiments of the present disclosure disclose a display panel and a method for assembling same and a spliced display device. In the display panel, a flexible base plate includes a first end portion, a second end portion, and a bent portion. The first end portion is connected to a binding portion, and the second end portion is disposed on a side of a back panel that is away from a display portion. The bent portion includes an inflection point. A tangent line passing through the inflection point is perpendicular to a plane where the binding portion is located. In an extending direction of the bent portion, a length from the inflection point to the first end portion is less than a length from the inflection point to the second end portion.

20 Claims, 4 Drawing Sheets

(51) Int. Cl.
*H01L 23/498* (2006.01)
*H05K 1/14* (2006.01)
*H05K 3/00* (2006.01)

(52) U.S. Cl.
CPC ........... *H05K 1/147* (2013.01); *H05K 3/0058* (2013.01); *H05K 2201/056* (2013.01); *H05K 2201/10128* (2013.01); *H05K 2201/10136* (2013.01)

(56) References Cited

U.S. PATENT DOCUMENTS

| | | | | |
|---|---|---|---|---|
| 6,664,942 B1 * | 12/2003 | Kim | .................... | G02F 1/13452 345/55 |
| 2005/0088830 A1 * | 4/2005 | Yumoto | ................ | H05K 1/147 174/254 |
| 2006/0109394 A1 * | 5/2006 | Miyagawa | ............. | H05K 3/361 349/149 |
| 2006/0221269 A1 * | 10/2006 | Kawaguchi | ............ | H05K 1/189 349/58 |
| 2009/0262277 A1 * | 10/2009 | Kim | ....................... | H05K 1/147 349/187 |
| 2010/0053493 A1 * | 3/2010 | Kuwajima | ........... | G02B 6/0073 349/58 |
| 2010/0226103 A1 * | 9/2010 | Muro | .................... | H05K 1/0215 174/254 |
| 2010/0279742 A1 * | 11/2010 | Miyashita | ................ | H05K 1/18 455/566 |
| 2010/0302478 A1 * | 12/2010 | Nakagawa | ........... | G02B 6/0091 349/62 |
| 2011/0067905 A1 * | 3/2011 | Su | ........................ | H05K 1/0281 174/254 |
| 2011/0076864 A1 | 3/2011 | Won et al. | | |
| 2011/0187965 A1 * | 8/2011 | Ooishi | .................... | H05K 1/028 361/749 |
| 2012/0287587 A1 * | 11/2012 | Los | ..................... | G06F 3/03547 361/749 |
| 2013/0148312 A1 * | 6/2013 | Han | ....................... | H05K 1/028 361/736 |
| 2019/0306994 A1 | 10/2019 | Taguchi | | |

FOREIGN PATENT DOCUMENTS

| | | | | |
|---|---|---|---|---|
| CN | 109065589 | | 12/2018 | |
| CN | 109065589 A | * | 12/2018 | ............ H10K 59/00 |
| CN | 208271896 | | 12/2018 | |
| CN | 109859642 | | 6/2019 | |
| CN | 109947297 | | 6/2019 | |
| CN | 110728907 | | 1/2020 | |
| CN | 112669715 | | 4/2021 | |
| CN | 107657188 | | 8/2022 | |

* cited by examiner

DISPLAY PANEL AND METHOD FOR ASSEMBLING SAME AND SPLICED DISPLAY DEVICE

RELATED APPLICATIONS

This application is a National Phase of PCT Patent Application No. PCT/CN2021/109157 having International filing date of Jul. 29, 2021, which claims the benefit of priority of Chinese Patent Application No. 202110598191.6 filed on May 31, 2021. The contents of the above applications are all incorporated by reference as if fully set forth herein in their entirety.

FIELD AND BACKGROUND OF THE INVENTION

The present disclosure relates to the field of display technologies, and in particular, to a display panel and a method for assembling same and a spliced display device.

During the research and practice of the prior art, the inventor of the present disclosure found that a flexible circuit board of the conventional display panel is bent to the back of the display panel. However, during the bending, a bending radius of the flexible circuit board is too large. Therefore, it is not conducive to implementation of a narrow frame, causing an excessively large gap between spliced panels.

SUMMARY OF THE INVENTION

Embodiments of the present disclosure provide a display panel and a method for assembling same and a spliced display device, so as to reduce a bending distance of the flexible circuit board.

Embodiments of the present disclosure provide a display panel, including:
a back panel;
a display portion, disposed on the back panel;
a binding portion, located on a side of the display portion and disposed on the back panel; and
a flexible base plate, including a first end portion, a second end portion, and a bent portion connecting the first end portion to the second end portion, wherein the first end portion is bound to the binding portion, and the second end portion is fixedly disposed on a side of the back panel that is away from the display portion;
in a pattern of a vertical section, the bent portion includes an inflection point, and a tangent line passing through the inflection point is perpendicular to a plane where the binding portion is located; and
in an extending direction of the bent portion, a length from the inflection point to the first end portion is less than a length from the inflection point to the second end portion.

Optionally, in some embodiments of the present disclosure, a distance from the first end portion to the tangent line is less than a distance from the second end portion to the tangent line.

Optionally, in some embodiments of the present disclosure, the bent portion includes a transition portion connected to the first end portion, and the transition portion abuts against an end corner of the binding portion.

Optionally, in some embodiments of the present disclosure, a stress on the transition portion is less than 12.5 newtons.

Optionally, in some embodiments of the present disclosure, the stress on the transition portion is greater than 1.7 newtons.

Optionally, in some embodiments of the present disclosure, the display panel further includes a protective layer and a connecting portion, the binding portion is connected to the display portion using the connecting portion, and the protective layer covers and is connected to the first end portion, and covers and is attached to the connecting portion.

Optionally, in some embodiments of the present disclosure, the display panel further includes a printed circuit board, the second end portion is bound to the printed circuit board, and the printed circuit board is fixedly disposed on the side of the back panel that is away from the display portion.

Optionally, in some embodiments of the present disclosure, the back panel includes a flat portion connected to the display portion and the binding portion and a bump disposed on a side of the flat portion that is away from the display portion, and the printed circuit board is fixedly disposed on a face of the bump that is away from the flat portion.

Optionally, in some embodiments of the present disclosure, the display panel further includes an adhesive layer, and the printed circuit board is fixedly connected to the bump using the adhesive layer.

Optionally, in some embodiments of the present disclosure, the stress on the transition portion is greater than 1.7 newtons.

Optionally, in some embodiments of the present disclosure, the display portion is one of a micro light-emitting diode (LED) display device, a sub-millimeter LED display device, a liquid crystal display device, an OLED display device, or a QLED display device.

Correspondingly, an embodiment of the present disclosure further provides a spliced display device, including a plurality of display panels of the above embodiments, wherein a plurality of the display panels are spliced, and each display panel includes:
a back panel;
a display portion, disposed on the back panel;
a binding portion, located on a side of the display portion and disposed on the back panel; and
a flexible base plate, including a first end portion, a second end portion, and a bent portion connecting the first end portion to the second end portion, wherein the first end portion is bound to the binding portion, and the second end portion is fixedly disposed on a side of the back panel that is away from the display portion;
the bent portion includes an inflection point, and a tangent line passing through the inflection point is perpendicular to a plane where the binding portion is located; and
in an extending direction of the bent portion, a length from the inflection point to the first end portion is less than a length from the inflection point to the second end portion.

Optionally, in some embodiments of the present disclosure, a distance from the first end portion to the tangent line is less than a distance from the second end portion to the tangent line.

Optionally, in some embodiments of the present disclosure, the bent portion includes a transition portion connected to the first end portion, and the transition portion abuts against an end corner of the binding portion.

Optionally, in some embodiments of the present disclosure, a stress on the transition portion is less than 12.5 newtons.

Optionally, in some embodiments of the present disclosure, the stress on the transition portion is greater than 1.7 newtons.

Optionally, in some embodiments of the present disclosure, the display panel further includes a printed circuit board, the second end portion is bound to the printed circuit board, and the printed circuit board is fixedly disposed on the side of the back panel that is away from the display portion.

Optionally, in some embodiments of the present disclosure, the back panel includes a flat portion connected to the display portion and the binding portion and a bump disposed on a side of the flat portion that is away from the display portion, and the printed circuit board is fixedly disposed on a face of the bump that is away from the flat portion.

Optionally, in some embodiments of the present disclosure, the display panel further includes an adhesive layer, and the printed circuit board is fixedly connected to the bump using the adhesive layer.

Correspondingly, an embodiment of the present disclosure further provides a method for assembling a display device, the method including:
- step B1: providing a to-be-bent display panel, wherein the to-be-bent display panel includes a back panel, a main display body, a flexible base plate, and a printed circuit board, the main display body is disposed on the back panel, one end of the flexible base plate is bound to the main display body, and an other end of the flexible base plate is bound to the printed circuit board;
- step B2: bending the flexible base plate, so that the printed circuit board is folded to a side of the back panel that is away from the main display body; and squeezing the bent flexible base plate using a first limiting plate of a limiting assembly, and squeezing a side of the back panel that is away from the flexible base plate using a second limiting plate of the limiting assembly, so as to limit a bending distance of the flexible base plate;
- step B3: pulling the printed circuit board, so that the flexible base plate enters a tightened state under a pulling force;
- step B4: fixing the printed circuit board to the back panel, wherein the flexible base plate is still in the tightened state; and
- step B5: separating the display panel from the limiting assembly.

Optionally, in some embodiments of the present disclosure, step B3 includes:
- pulling the printed circuit board to a first preset angle, so that the flexible base plate enters a tightened state, and maintaining the flexible base plate to be in the tightened state for a first set duration; and
- pulling the printed circuit board at a constant pulling force, so that the printed circuit board approaches the back panel, until the printed circuit board is parallel to a plane where the back panel is located.

Optionally, in some embodiments of the present disclosure, step B3 includes:
- pulling the printed circuit board in a direction perpendicular to a plane where the display panel is located, until the flexible base plate enters a tightened state, and maintaining the flexible base plate to be in the tightened state for a first set duration;
- pulling the printed circuit board at a constant pulling force, lowering the printed circuit board to a second preset angle, and maintaining the printed circuit board to be at the second preset angle for a second set duration; and
- pulling the printed circuit board at the constant pulling force, so that the printed circuit board approaches the back panel, until the printed circuit board is parallel to a plane where the back panel is located; and maintaining the printed circuit board to be parallel to the plane for a third set duration, wherein the third set duration is greater than the second set duration.

Optionally, in some embodiments of the present disclosure, the limiting assembly includes a first flexible layer, a second flexible layer, and a base plate. The first limiting plate is disposed on one side of the base plate, and the second limiting plate is disposed on an other side of the base plate. The first flexible layer is disposed on a side of the first limiting plate that faces the second limiting plate, and the second flexible layer is disposed on a side of the second limiting plate that faces the first limiting plate.

In the embodiments of the present disclosure, the inflection point of the flexible base plate in the bent state is set closer to the side of the first end portion, thereby reducing the bending distance of the flexible base plate, achieving a narrow frame or even no frame, and reducing splicing gaps of the spliced display device.

BRIEF DESCRIPTION OF THE SEVERAL VIEWS OF THE DRAWINGS

To describe the technical solutions in the embodiments of the present disclosure more clearly, the accompanying drawings required for describing the embodiments are briefly described hereinafter. Apparently, the accompanying drawings in the following descriptions show merely some embodiments of the present disclosure, and a person skilled in the art may obtain other accompanying drawings according to these accompanying drawings without creative efforts.

DESCRIPTION OF SPECIFIC EMBODIMENTS OF THE INVENTION

The technical solutions of the embodiments of the present disclosure are clearly and completely described in the following with reference to the accompanying drawings of the embodiments of the present disclosure. Apparently, the described embodiments are merely some but not all of the embodiments of the present disclosure. All other embodiments obtained by a person skilled in the art based on the embodiments of the present disclosure without creative efforts shall fall within the protection scope of the present disclosure. In addition, it should be understood that the specific implementations described herein are merely used for describing and illustrating the present disclosure, but are not intended to limit the present disclosure. In the present disclosure, unless otherwise stated, the directional terms such as "up" and "down" generally refer to directions when a device is in actual use or a working state, and specifically refer to drawing directions in the corresponding drawing; and "inside" and "outside" refer to positions relative to the contour of the device.

A display panel and a method for assembling same, and a spliced display device is provided in the embodiments of the present disclosure, and details are described below. It should be noted that, the description order of the following embodiments is not intended to limit preference orders of the embodiments.

Figure 1:
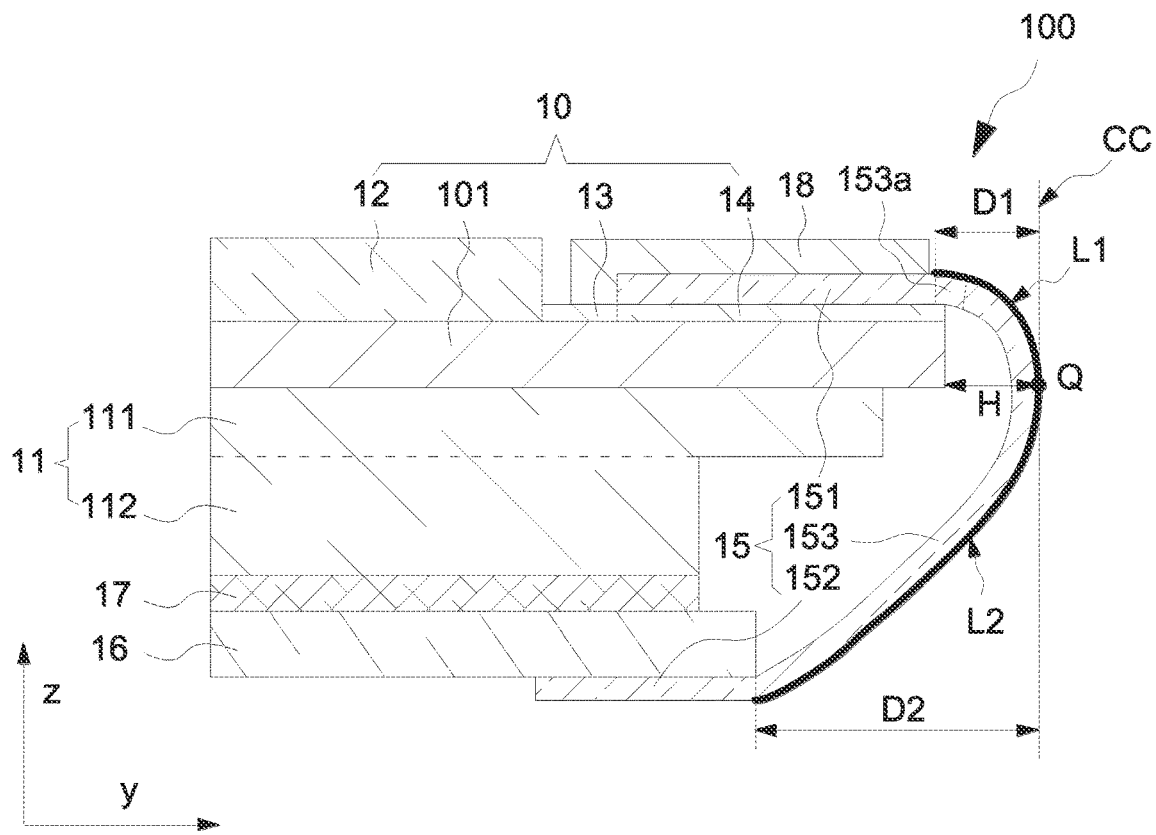
FIG. 1 is a schematic diagram of a structure of a display panel according to an embodiment of the present disclosure.

Referring to FIG. 1, the embodiment of the present disclosure provides a display panel 100. The display panel includes a back panel 11, a main display body 10, a flexible base plate 15, a printed circuit board 16, an adhesive layer 17, and a protective layer 18. The main display body 10 includes a substrate 101 and a display portion 12, a connecting portion 13, and a binding portion 14 that are disposed on the substrate 101.

Optionally, the display portion 12 may be one of a micro LED display device, a sub-millimeter LED display device, a liquid crystal display device, an OLED display device, or a QLED display device.

Optionally, the flexible base plate 15 may be a chip on film or a flexible circuit board that is not a chip on film.

The display portion 12, the connecting portion 13, and the binding portion 14 are all disposed on the back panel 11. The binding portion 14 is located on a side of the display portion 12 and is connected to the display portion 12 using the connecting portion 13.

The flexible base plate 15 includes a first end portion 151, a second end portion 152, and a bent portion 153 connecting the first end portion 151 to the second end portion 152. The first end portion 151 is bonded to the binding portion 14. The second end portion 152 is fixedly disposed on a side of the back panel 11 that is away from the display portion 12.

The second end portion 152 is bonded to the printed circuit board 16. The printed circuit board 16 is fixedly disposed on a side of the back panel 11 that is away from the display portion 12.

In some embodiments, the printed circuit board 16 may also be omitted. That is to say, the second end portion 152 is fixed on the back panel 11.

The protective layer 18 is disposed on the first end portion 151. The protective layer 18 covers and is connected to the first end portion 151, and covers and is attached to the connecting portion 13, so as to reduce the risk of separating the flexible base plate 15 from the display panel 100. Therefore, a degree of bending of the flexible base plate 15 can be increased, and a bending distance of the flexible base plate 15 can be reduced.

In detail, one end of the protective layer 18 extends to a junction of the first end portion 151 and the bent portion 153 at most, and an other end of the protective layer 18 extends to the connecting portion 13 and is connected to the connecting portion 13. The protective layer 18 does not cover a bent area to reduce the bending distance of the flexible base plate 15.

Optionally, the protective layer 18 may be a thermal curing adhesive, a moisture curing adhesive, or a light curing adhesive.

A larger connection area of the protective layer 18 and the connecting portion 13 indicates a lower risk of separating the flexible base plate 15 from the display panel 100.

Optionally, when a connecting width between the protective layer 18 and the connecting portion 13 is 1 mm, a thickness of the protective layer 18 is 0.4 mm, and the bending distance of the flexible base plate 15 is 0.2 mm.

Optionally, the printed circuit board 16 is fixedly connected to the back panel 11 using an adhesive layer 17.

Optionally, the adhesive layer 17 may be a double-sided foam adhesive.

Optionally, the substrate 101 may be a flexible substrate, such as polyimide, or may be a rigid substrate, such as glass, sapphire, silicide, or the like.

Optionally, the binding portion 14 includes a plurality of terminals. The flexible base plate 15 may be bonded to the plurality of terminals using conductive glue.

In a pattern of a vertical section, the bent portion 153 includes an inflection point Q, and a tangent line CC passing through the inflection point Q is perpendicular to a plane where the binding portion 14 is located.

It should be noted that the vertical section is perpendicular to the plane where the display panel 100 is located. If the plane where the display panel 100 is located is defined to be parallel to a plane composed of an axis x and an axis y in a three-dimensional Cartesian coordinate system, a vertical plane is parallel to the plane composed of the axis x and the axis y in the three-dimensional Cartesian coordinate system, and the vertical section sequentially extends through the first end portion 151, the bent portion 153, and the second end portion 152.

In an extending direction of the bent portion 153, a length L1 from the inflection point Q to the first end portion 151 is less than a length L2 from the inflection point Q to the second end portion 152.

In the present embodiment, the bent flexible base plate 15 is in a tightened state, and the inflection point Q of the flexible base plate 15 is disposed closer to a side of the first end portion 151. That is to say, the length L1 from the inflection point Q to the first end portion 151 is less than the length L2 from the inflection point Q to the second end portion 152. Therefore, a bending distance H of the flexible base plate 15 is reduced, so as to achieve a narrow frame or even no frame, and splicing gaps of the spliced display device are reduced.

Optionally, in the present embodiment, a distance D1 from the first end portion 151 to the tangent line CC is less than a distance D2 from the second end portion 152 to the tangent line CC, so that the inflection point Q is closer to a side of the first end portion 151.

Optionally, since the distance D1 from the first end portion 151 to the tangent line CC is less than the distance D2 from the second end portion 152 to the tangent line CC, a part of the bent portion 153 squeezes an end corner of the binding portion 14.

In detail, the bent portion 153 includes a transition portion 153a connected to the first end portion 151. The transition portion 153a abuts against the end corner of the binding portion 14. That is to say, the transition portion 153a squeezes the end corner of the binding portion 14. At this point, a stress on the transition portion 153a includes a reaction force of the end corner of the binding portion 14 and a bending stress of the transition portion itself.

Optionally, the stress on the transition portion 153a is less than 12.5 newtons, such as 12 newtons, 11 newtons, 10 newtons, 9 newtons, 8 newtons, 7 newtons, 6 newtons, 5 newtons, 4 newtons, 3 newtons, 2 newtons, or 1 newton, so as to reduce the risk of breakage of traces in the flexible base plate 15.

Optionally, the stress on the transition portion 153a is greater than 1.7 newtons, so as to cause the bending distance of the flexible base plate 15 to be less than or equal to 0.2 mm as far as possible.

If the flexible base plate 15 requires a smaller distance, the second end portion 152 may be moved to an other side of the back panel 11 to reduce the bending distance H of the flexible base panel 15, thereby increasing the stress on the transition portion 153a.

After the flexible base plate 15 is bent, the stress on the transition portion 153a is related to the thickness, the elastic modulus, and the bending distance of the flexible base plate 15. When the thickness is the only variable, a larger thickness indicates a larger stress on the transition portion 153a. When the elastic modulus is the only variable, a larger elastic modulus indicates a larger stress on the transition portion 153a. When the bending distance is the only variable, a larger bending distance indicates a smaller stress on the transition portion 153a.

The back panel 11 includes a flat portion 111 connected to the display portion 12 and the binding portion 14 and a bump 112 disposed on a side of the flat portion 111 that is away from the display portion 12. The printed circuit board 16 is fixedly disposed on a face of the bump 112 that is away from the flat portion 111 using the adhesive layer 17.

The bump 112 can increase a distance between the first end portion 151 and the second end portion 152, thereby reducing the bending distance of the flexible base plate 15.

Optionally, the bump 112 is spaced apart from the flexible base plate 15 to prevent the bump 112 from interfering with the bending of the flexible base plate 15.

Optionally, a material of the back panel 11 may be aluminum, iron, or alloy.

Correspondingly, an embodiment of the present disclosure further provides a method for assembling a display panel 100 of the above embodiment. The method includes steps as follows.

Step B1: Provide a to-be-bent display panel, wherein the to-be-bent display panel includes a back panel, a main display body, a flexible base plate, and a printed circuit board, the main display body is disposed on the back panel, one end of the flexible base plate is bound to the main display body, and an other end of the flexible base plate is bound to the printed circuit board.

Step B2: Bend the flexible base plate, so that the printed circuit board is folded to a side of the back panel that is away from the main display body; and squeeze the bent flexible base plate using a first limiting plate of a limiting assembly, and squeeze a side of the back panel that is away from the flexible base plate using a second limiting plate of the limiting assembly, so as to limit a bending distance of the flexible base plate.

Step B3: Pull the printed circuit board, so that the flexible base plate enters a tightened state under a pulling force.

Step B4: Fix the printed circuit board to the back panel, wherein the flexible base plate is still in the tightened state; and Step B5: Separate the display panel from the limiting assembly.

According to the method for assembling a display panel 100 of the present embodiment, the limiting assembly is used to limit the bending distance of the flexible base plate 15 in a prepressing manner, and then the flexible base plate 15 is shaped, thereby achieving the effect of reducing the bending distance.

The steps of the method for assembling a display panel 100 are described below.

Figure 2:
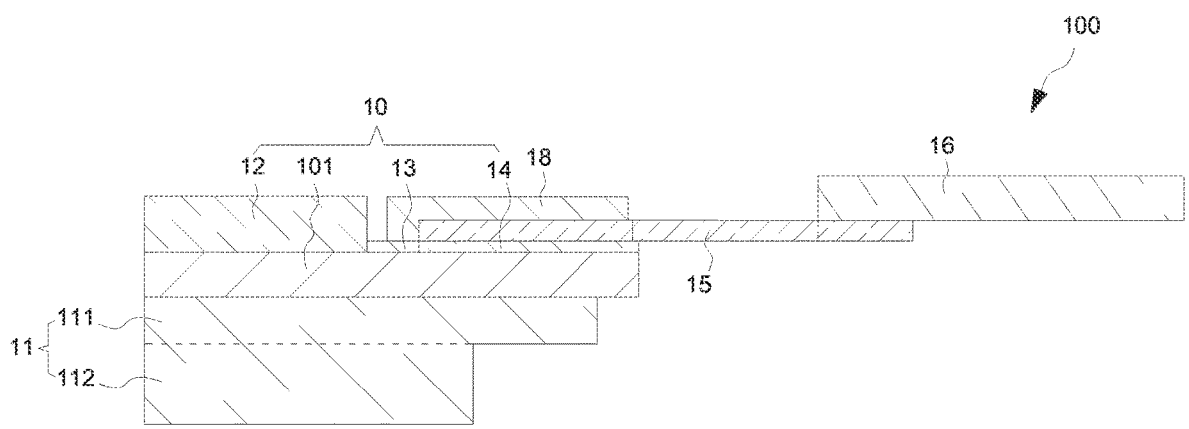
FIG. 2 is a schematic diagram of step B1 of a method for assembling a display panel according to an embodiment of the present disclosure.

Referring to FIG. 2, step B1 is to provide a to-be-bent display panel 100. The to-be-bent display panel 100 includes a back panel 11, a main display body 10, a flexible base plate and a printed circuit board 16. The main display body 10 is disposed on the back panel 11. One end of the flexible base plate 15 is bonded to the main display body 10. An other end of the flexible base plate 15 is bonded to the printed circuit board 16. The main display body 10 includes a display portion 12 and a binding portion 14.

Then step B2 is performed.

Figure 3:
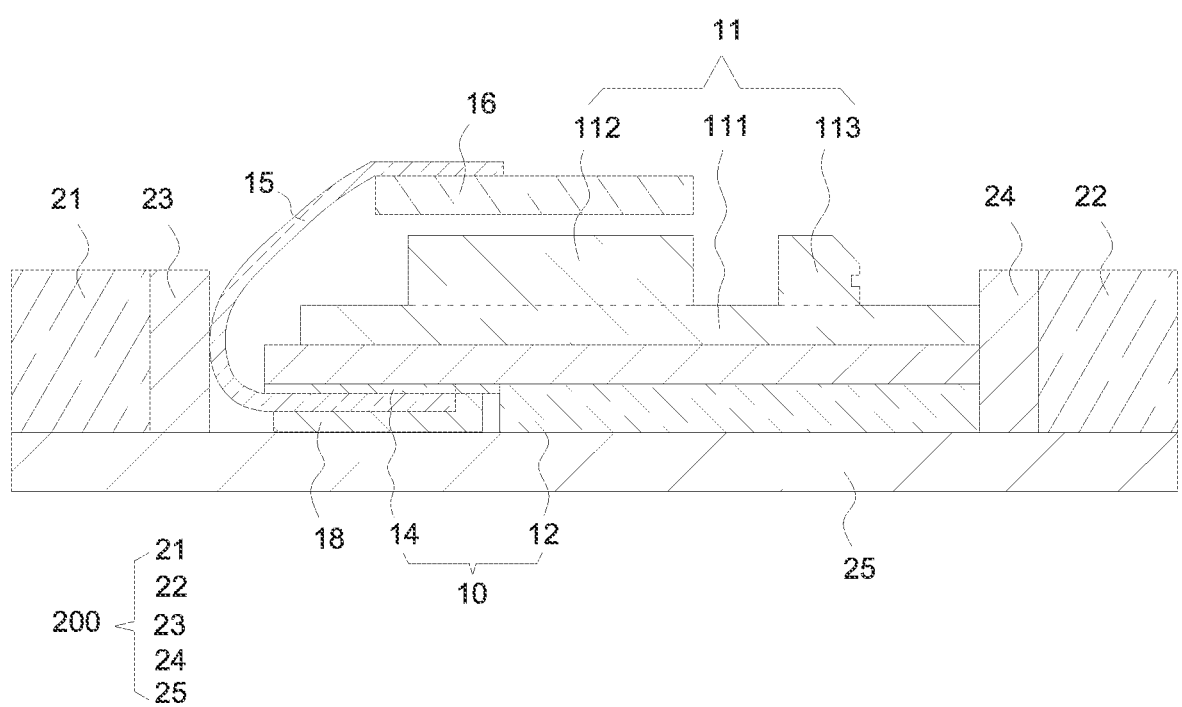
FIG. 3 is a schematic diagram of step B2 of the method for assembling a display panel according to an embodiment of the present disclosure.

Referring to FIG. 3, step B2 includes: bending the flexible base plate 15, so that the printed circuit board 16 is folded to a side of the back panel 11 that is away from the main display body 10, squeezing the bent flexible base plate 15 using a first limiting plate 21 of a limiting assembly 200, and squeezing a side of the back panel 11 that is away from the flexible base plate 15 using a second limiting plate 22 of the limiting assembly 200, so as to limit a bending distance of the flexible base plate 15.

Therefore, in the present embodiment, the flexible base plate 15 is prepressed using step B2 to preliminarily reduce the bending distance H of the flexible base plate 15.

Optionally, the limiting assembly 200 further includes a first flexible layer 23, a second flexible layer 24, and a base plate 25. The first limiting plate 21 is disposed on one side of the base plate 25, and the second limiting plate 22 is disposed on an other side of the base plate 25. The first flexible layer 23 is disposed on a side of the first limiting plate 21 that faces the second limiting plate 22. The second flexible layer 24 is disposed on a side of the second limiting plate 22 that faces the first limiting plate 21.

The first flexible layer 23 and the second flexible layer 24 are in contact with the display panel 100. On the one hand, the limiting assembly 200 can be prevented from crushing the display panel 100, and on the other hand, it is convenient to put in and take out the display panel 100.

Optionally, the first limiting plate 21 may be slidably disposed on the base plate 25 to facilitate adjustment of the bending distance of the flexible base plate 15 and facilitate adaption to display panels 100 of different sizes.

Then step B3 is performed.

Figure 4:
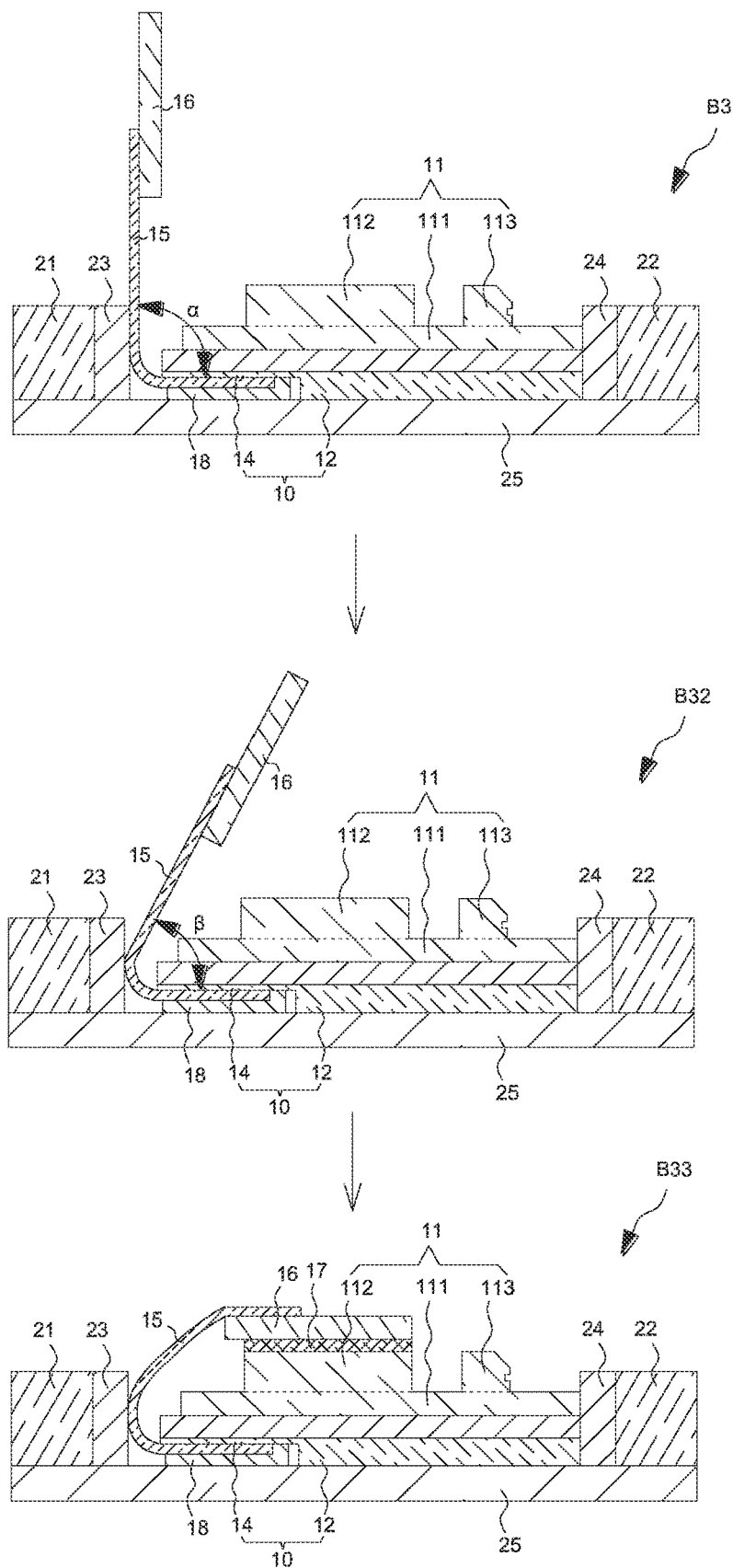
FIG. 4 is a schematic diagram of step B3 of the method for assembling a display panel according to an embodiment of the present disclosure.

Referring to FIG. 4, step B3 includes: pulling the printed circuit board 16, so that the flexible base plate 15 enters a tightened state under a pulling force.

In detail, step B3 includes step B31, step B32, and step B33.

Step B31: Pull the printed circuit board 16 to a first preset angle α, so that the flexible base plate 15 enters a tightened state, and maintain the flexible base plate in the tightened state for a first set duration.

Optionally, the first preset angle α is greater than or equal to 60 degrees. For example, the first preset angle may be 60 degrees, 70 degrees, 80 degrees, or 90 degrees. When the printed circuit board 16 is pulled, the flexible base plate 15 is prevented from being scratched by the binding portion 14.

Optionally, a rope is used to pull the printed circuit board 16 in a direction perpendicular to a plane where the display panel 100 is located, that is, in a direction at a preset angle of 90 degrees, to ensure that the flexible base plate 15 is not scratched by the binding portion 14.

It should be noted that the use of a rope (not shown in the figure) to pull the printed circuit board 16 is only one of the ways to pull the printed circuit board 16. The present embodiment is not limited to this method. For example, an automated device, such as a manipulator may be used to pull the printed circuit board 16.

Optionally, the first set duration is greater than or equal to 30 seconds. For example, the first set duration may be 30 seconds, 1 minute, 3 minutes, 5 minutes, 10 minutes, or the like, so as to pre-limit the bending distance H of the flexible base plate 15 and buffer the strength of instant bending of the flexible base plate 15, thereby reducing the risk of damage to the traces in the flexible base plate 15.

Since the protective layer 18 is used to bond the first end portion 151 to the connecting portion 13, the pulling force for pulling the printed circuit board 16 can be appropriately increased without separating the flexible base plate 15 from the display panel 100. Therefore, the bending distance of the flexible base plate 15 can be further reduced.

Step B32: Pull the printed circuit board 16 at a constant pulling force, lower the printed circuit board 16 to a second preset angle β, and maintain the printed circuit board to be at the second preset angle for a second set duration.

The printed circuit board 16 and the flexible base plate 15 are temporarily fixed at the second preset angle β, so as to reduce the degree of bending of the flexible base plate 15 and avoid the risk of damage to the flexible base plate 15 due to instant bending.

The second preset angle β is greater than or equal to 60 degrees and less than 90 degrees. For example, the second preset angle may be 60 degrees, 70 degrees, or 80 degrees.

Optionally, the second set duration is greater than or equal to 30 seconds. For example, the second set duration may be 30 seconds, 1 minute, 3 minutes, 5 minutes, 10 minutes, or the like. In this way, the flexible base plate 15 has a stable bending state. With the decline of the printed circuit board 16, a larger degree of bending of the flexible base plate 15 and a larger applied stress indicate a larger risk of damage to the flexible base plate 15. Therefore, the second set duration is greater than the first set duration. The flexibility of the flexible base plate 15 to bend is improved, and the risk of damage to the flexible base plate 15 is further reduced.

Step B33: Pull the printed circuit board 16 at the constant pulling force, so that the printed circuit board 16 approaches the back panel 11, until the printed circuit board 16 is parallel to a plane where the back panel 11 is located, and maintain the printed circuit board to be parallel to the plane for a third set duration, If a rope is used to pull the printed circuit board 16, the rope is fixed in a groove of a fixing block 113 of the back panel 11 to fix the bending shape of the flexible base plate 15.

Optionally, the third set duration is greater than or equal to 30 seconds. For example, the third set duration may be 30 seconds, 1 minute, 3 minutes, 5 minutes, 10 minutes, or the like. In this way, the flexible base plate 15 has a stable bending state.

The third set duration is greater than the second set duration, so that the flexible base plate 15 has a stable bending state.

In the present embodiment, the flexible base plate 15 is pulled using step B3, so that the inflection point of the flexible base plate 15 approaches a side of the first end portion 151. In addition, on a basis of preliminary reduction of the bending distance of the flexible base plate 15, the bending distance of the flexible base plate 15 is further minimally reduced. In this way, the bending distance of the flexible base plate 15 can reach a target bending distance, and the risk of damage to the traces in the flexible base plate 15 can be reduced.

Then step B4 is performed.

Figure 5:
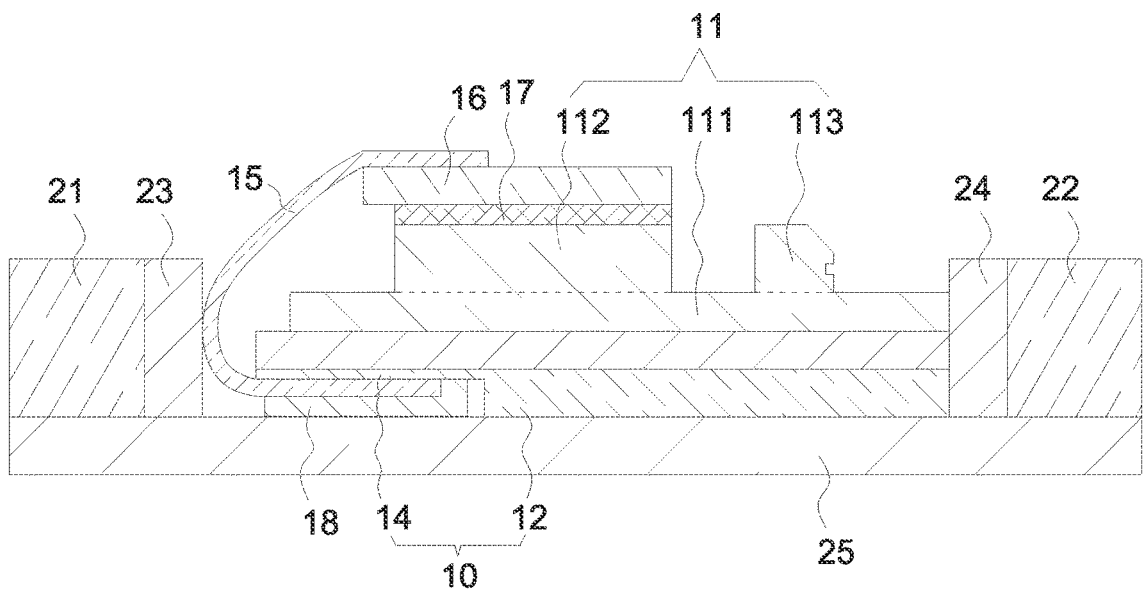
FIG. 5 is a schematic diagram of step B4 of a method for assembling a display panel according to an embodiment of the present disclosure.

Referring to FIG. 5, step B4 is to fix the printed circuit board 16 to the back panel 11. The flexible base plate 15 is still in a tightened state.

Optionally, the back panel 11 is fixedly connected to the printed circuit board 16 using an adhesive layer 17.

Then step B5 is performed.

Referring to FIG. 1, step B5 is to separate the display panel 100 from the limiting assembly 200. The distance D1 from the first end portion 151 to the tangent line CC is less than the distance D2 from the second end portion 152 to the tangent line CC.

In this way, the method for assembling a display panel 100 of the present embodiment is completed.

Figure 6:
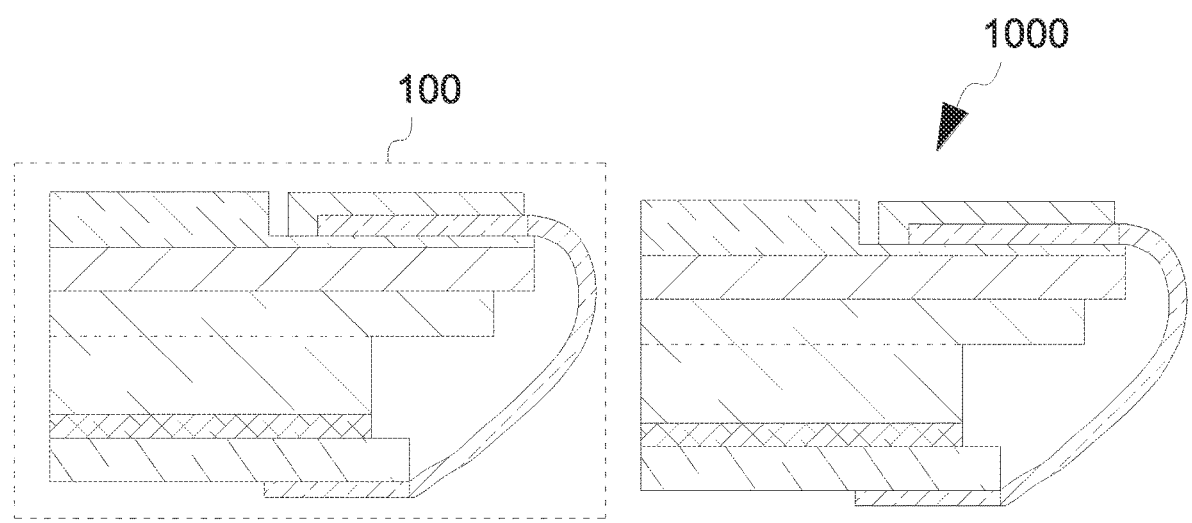
FIG. 6 is a schematic diagram of a structure of a spliced display device according to an embodiment of the present disclosure.

Referring to FIG. 6, correspondingly, an embodiment of the present disclosure further provides a spliced display device 1000. The spliced display device includes the plurality of display panels 100 of the above embodiments. The plurality of display panels 100 are spliced.

A display panel and a method for assembling same and a spliced display device provided in the embodiments of the present disclosure are described above in detail. Although the principles and implementations of the present disclosure are described by using specific examples in this specification, the descriptions of the foregoing embodiments are merely used for helping understand the method and the core idea of the method of the present disclosure. Meanwhile, a person of ordinary skill in the art may make modifications to the specific implementations and application range according to the ideas of the present disclosure. In conclusion, the content of the specification is not to be construed as a limitation to the present disclosure.

What is claimed is:

1. A display panel, comprising:
   a back panel;
   a display portion, disposed on the back panel;
   a binding portion, located on a side of the display portion and disposed on the back panel; and
   a flexible base plate, comprising a first end portion, a second end portion, and a bent portion connecting the first end portion to the second end portion, wherein the first end portion is bound to the binding portion, and the second end portion is fixedly disposed on a side of the back panel that is away from the display portion;
   the bent portion comprises an inflection point, and a tangent line passing through the inflection point is perpendicular to a plane where the binding portion is located; and
   in an extending direction of the bent portion, a length from the inflection point to the first end portion is less than a length from the inflection point to the second end portion.

2. The display panel as claimed in claim 1, wherein a distance from the first end portion to the tangent line is less than a distance from the second end portion to the tangent line.

3. The display panel as claimed in claim 2, wherein the bent portion comprises a transition portion connected to the first end portion, and the transition portion abuts against an end corner of the binding portion.

4. The display panel as claimed in claim 3, wherein a stress on the transition portion is less than 12.5 newtons.

5. The display panel as claimed in claim 4, wherein the stress on the transition portion is greater than 1.7 newtons.

6. The display panel as claimed in claim 1, further comprising a protective layer and a connecting portion, wherein the binding portion is connected to the display portion using the connecting portion, and the protective layer covers and is connected to the first end portion and covers and is attached to the connecting portion.

7. The display panel as claimed in claim 1, further comprising a printed circuit board, wherein the second end portion is bound to the printed circuit board, and the printed circuit board is fixedly disposed on the side of the back panel that is away from the display portion.

8. The display panel as claimed in claim 7, wherein the back panel comprises a flat portion connected to the display portion and the binding portion and a bump disposed on a side of the flat portion that is away from the display portion, and the printed circuit board is fixedly disposed on a face of the bump that is away from the flat portion.

9. The display panel as claimed in claim 7, further comprising an adhesive layer, wherein the printed circuit board is fixedly connected to the bump using the adhesive layer.

10. A spliced display device, wherein a plurality of display panels are spliced, and each display panel comprises:
   a back panel;
   a display portion, disposed on the back panel;
   a binding portion, located on a side of the display portion and disposed on the back panel; and
   a flexible base plate, comprising a first end portion, a second end portion, and a bent portion connecting the first end portion to the second end portion, wherein the first end portion is bound to the binding portion, and the second end portion is fixedly disposed on a side of the back panel that is away from the display portion;
   the bent portion comprises an inflection point, and a tangent line passing through the inflection point is perpendicular to a plane where the binding portion is located; and
   in an extending direction of the bent portion, a length from the inflection point to the first end portion is less than a length from the inflection point to the second end portion.

11. The spliced display device as claimed in claim 10, wherein a distance from the first end portion to the tangent line is less than a distance from the second end portion to the tangent line.

12. The spliced display device as claimed in claim 11, wherein the bent portion comprises a transition portion connected to the first end portion, and the transition portion abuts against an end corner of the binding portion.

13. The spliced display device as claimed in claim 12, wherein a stress on the transition portion is less than 12.5 newtons.

14. The spliced display device as claimed in claim 13, wherein the stress on the transition portion is greater than 1.7 newtons.

15. The spliced display device as claimed in claim 10, wherein the display panel further comprises a printed circuit board, the second end portion is bound to the printed circuit board, and the printed circuit board is fixedly disposed on the side of the back panel that is away from the display portion.

16. The spliced display device as claimed in claim 15, wherein the back panel comprises a flat portion connected to the display portion and the binding portion and a bump disposed on a side of the flat portion that is away from the display portion, and the printed circuit board is fixedly disposed on a face of the bump that is away from the flat portion.

17. The spliced display device as claimed in claim 16, wherein the display panel further comprises an adhesive layer, and the printed circuit board is fixedly connected to the bump using the adhesive layer.

18. A method for assembling a display panel, the method comprising:
   step B1: providing a to-be-bent display panel, wherein the to-be-bent display panel comprises a back panel, a main display body, a flexible base plate, and a printed circuit board, the main display body is disposed on the back panel, one end of the flexible base plate is bound to the main display body, and an other end of the flexible base plate is bound to the printed circuit board;
   step B2: bending the flexible base plate, so that the printed circuit board is folded to a side of the back panel that is away from the main display body; and squeezing the bent flexible base plate using a first limiting plate of a limiting assembly, and squeezing a side of the back panel that is away from the flexible base plate using a second limiting plate of the limiting assembly, so as to limit a bending distance of the flexible base plate;
   step B3: pulling the printed circuit board, so that the flexible base plate enters a tightened state under a pulling force;
   step B4: fixing the printed circuit board to the back panel, wherein the flexible base plate is still in the tightened state; and
   step B5: separating the display panel from the limiting assembly.

19. The method for assembling a display panel as claimed in claim 18, wherein step B3 comprises:
   pulling the printed circuit board to a first preset angle, so that the flexible base plate enters a tightened state, and maintaining the flexible base plate to be in the tightened state for a first set duration; and
   pulling the printed circuit board at a constant pulling force, so that the printed circuit board approaches the back panel, until the printed circuit board is parallel to a plane where the back panel is located.

20. The method for assembling a display panel as claimed in claim 19, wherein step B3 comprises:
   pulling the printed circuit board in a direction perpendicular to a plane where the display panel is located, until the flexible base plate enters a tightened state, and maintaining the flexible base plate to be in the tightened state for a first set duration;
   pulling the printed circuit board at a constant pulling force, lowering the printed circuit board to a second preset angle, and maintaining the printed circuit board to be at the second preset angle for a second set duration; and
   pulling the printed circuit board at the constant pulling force, so that the printed circuit board approaches the back panel, until the printed circuit board is parallel to a plane where the back panel is located, and maintaining the printed circuit board to be parallel to the plane for a third set duration, wherein the third set duration is greater than the second set duration.

* * * * *